United States Patent
Iwata et al.

(10) Patent No.: US 7,282,132 B2
(45) Date of Patent: Oct. 16, 2007

(54) ZINC OXIDE FILM TREATMENT METHOD AND METHOD OF MANUFACTURING PHOTOVOLTAIC DEVICE UTILIZING THE SAME

(75) Inventors: Masumitsu Iwata, Kyoto (JP); Noboru Toyama, Osaka (JP); Ryo Hayashi, Nara (JP); Yuichi Sonoda, Nara (JP); Tomonori Nishimoto, Kyoto (JP); Takaharu Kondo, Kyoto (JP); Satoru Yamada, Kyoto (JP); Yusuke Miyamoto, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 569 days.

(21) Appl. No.: 10/805,323

(22) Filed: Mar. 22, 2004

(65) Prior Publication Data

US 2004/0191949 A1   Sep. 30, 2004

(30) Foreign Application Priority Data

Mar. 25, 2003   (JP) .............................. 2003-081785

(51) Int. Cl.
   *C25D 5/50*   (2006.01)
(52) U.S. Cl. ...................... 205/199; 205/224; 438/71
(58) Field of Classification Search ............... 205/224, 205/199
   See application file for complete search history.

(56) References Cited

U.S. PATENT DOCUMENTS

| 5,486,238 A | 1/1996 | Nakagawa et al. ......... 136/259 |
| 5,578,141 A | 11/1996 | Mori et al. ................. 136/251 |
| 5,660,646 A | 8/1997 | Kataoka et al. ............. 136/251 |
| 5,679,181 A * | 10/1997 | Ohmura et al. ............. 148/518 |
| 5,684,325 A | 11/1997 | Kataoka et al. ............. 257/433 |
| 5,718,772 A | 2/1998 | Mori et al. .................. 136/251 |
| 5,770,463 A | 6/1998 | Nakagawa et al. ............ 437/2 |
| 5,800,631 A | 9/1998 | Yamada et al. ............. 136/251 |
| 5,804,466 A * | 9/1998 | Arao et al. .................... 438/95 |
| 5,973,258 A | 10/1999 | Shiotsuka et al. .......... 136/252 |
| 6,034,323 A | 3/2000 | Yamada et al. ............. 136/259 |

(Continued)

FOREIGN PATENT DOCUMENTS

CN   1362731   8/2002

(Continued)

OTHER PUBLICATIONS

Y. Inoue et al., "Optical Confinement Effect in a-SiGe Solar Cells on Stainless Steel Substrates", 29p-MF-2, 51st Applied Physics Society Scientific Lecture Meeting, Lecture Drafts, Autumn 1990, p. 747. (English-language translation attached).

(Continued)

*Primary Examiner*—Hoy King
*Assistant Examiner*—William T. Leader
(74) *Attorney, Agent, or Firm*—Fitzpatrick, Cella, Harper & Scinto

(57) ABSTRACT

A film of zinc oxide electrochemically deposited from an aqueous solution is subjected to heat treatment at a temperature equal to or higher than 150° C. and equal to or lower than 400° C. in a nitrogen or inert gas atmosphere that contains oxygen, thereby obtaining a zinc oxide film that is low in electric resistance without impairing the light transmittance of the zinc oxide film.

6 Claims, 6 Drawing Sheets

U.S. PATENT DOCUMENTS

| | | |
|---|---|---|
| 6,113,718 A | 9/2000 | Yamada et al. ............... 156/78 |
| 6,133,061 A | 10/2000 | Sonoda ........................ 438/69 |
| 6,133,522 A | 10/2000 | Kataoka et al. ............. 136/259 |
| 6,162,986 A | 12/2000 | Shiotsuka et al. .......... 136/244 |
| 6,172,296 B1 | 1/2001 | Iwasaki et al. ............. 136/256 |
| 6,175,075 B1 | 1/2001 | Shiotsuka et al. .......... 136/251 |
| 6,307,145 B1 | 10/2001 | Kataoka et al. ............. 136/251 |
| 6,316,832 B1 | 11/2001 | Tsuzuki et al. ............. 257/747 |
| 6,320,115 B1 | 11/2001 | Kataoka et al. ............. 136/251 |
| 6,331,474 B1 | 12/2001 | Hayashi et al. ............. 438/476 |
| 6,399,873 B1 | 6/2002 | Sano et al. ................. 136/249 |
| 6,414,236 B1 | 7/2002 | Kataoka et al. ............. 136/251 |
| 6,472,248 B2 | 10/2002 | Shiozaki et al. ............. 438/97 |
| 6,488,995 B1 | 12/2002 | Nishimoto et al. ......... 427/574 |
| 6,515,216 B2 | 2/2003 | Zenko et al. ............... 136/244 |
| 6,544,877 B1 | 4/2003 | Sonoda et al. ............. 438/609 |
| 6,576,112 B2 | 6/2003 | Sonoda et al. ............. 205/155 |
| 6,653,165 B2 | 11/2003 | Kondo et al. ................. 438/73 |
| 6,660,931 B2 | 12/2003 | Toyama et al. ............. 136/256 |
| 6,664,597 B2 | 12/2003 | Takeyama et al. .......... 257/347 |
| 6,693,237 B2 | 2/2004 | Zenko et al. ............... 136/251 |
| 6,706,336 B2 | 3/2004 | Kondo et al. ............... 427/588 |
| 6,806,505 B2 * | 10/2004 | Kojima et al. ................. 257/86 |
| 2002/0117661 A1 | 8/2002 | Kondo et al. ................. 257/21 |
| 2003/0028486 A1 | 2/2003 | Nakamura .................... 705/50 |
| 2003/0075717 A1 | 4/2003 | Kondo et al. ................. 257/64 |
| 2003/0104664 A1 | 6/2003 | Kondo et al. ............... 438/200 |
| 2003/0153165 A1 | 8/2003 | Kondo et al. ............... 438/478 |
| 2004/0067321 A1 | 4/2004 | Kondo et al. ............. 427/419.1 |

FOREIGN PATENT DOCUMENTS

| | | |
|---|---|---|
| JP | 4-119843 | 4/1992 |
| JP | 10-140373 | 5/1998 |
| JP | 2001-152390 | 6/2001 |
| JP | 3273294 | 2/2002 |
| JP | 2002-237606 | 8/2002 |
| JP | 2002-261040 | 9/2002 |

OTHER PUBLICATIONS

H. Sannoniya et al., "a-SiC/a-Si/a-SiGe Multi-Bandgap Stacked Solar Cells with Bandgap Profiling", Technical Digest of the International PVSEC-5, Kyoto, Japan, 1990, pp. 387-390.

* cited by examiner

ZINC OXIDE FILM TREATMENT METHOD AND METHOD OF MANUFACTURING PHOTOVOLTAIC DEVICE UTILIZING THE SAME

BACKGROUND OF THE INVENTION

1. Field of the Invention

The present invention relates to a method of treating a zinc oxide film that is formed by electrochemical deposition, a method of manufacturing a photovoltaic device utilizing the same, and a zinc oxide film treatment apparatus.

2. Related Background Art

Photovoltaic devices including hydrogenated amorphous silicon, hydrogenated amorphous silicon germanium, hydrogenated amorphous silicon carbide, microcrystalline silicon, or polycrystalline silicon, are conventionally provided with back side reflection layers in order to improve light-collection efficiency in the long-wavelength regions. Such reflection layers desirably show effective reflection characteristics at wavelengths which are close to band edges of semiconductor materials and at which absorption becomes small, i.e., wavelengths of 800 nm to 1,200. Those that can fulfill such conditions are reflection layers formed of a metal such as gold, silver, copper, or aluminum, or alloys thereof. Also, the following attempt, which is known as the light entrapment experiment, has been done: an irregular transparent electroconductive layer, which is optically transparent, is provided within a predetermined wavelength region so that reflected light can effectively be utilized to improve short-circuit current density Jsc. Further, the transparent conductive layer also prevents characteristics from deteriorating owing to shunt pass. In most general cases, those layers are deposited by a process such as vacuum evaporation or sputtering and show an improvement in short-circuit current density.

As an example thereof, in "Light Entrapment Effect in a-SiGe Solar Cells on 29p-MF-22 Stainless Steel Substrates" (Autumn, 1990), The 51st Applied Physics Society Scientific Lecture Meeting, Lecture Drafts p.747, "P-IA-15a-SiC/a-Si/a-SiGe Multi-Bandgap Stacked Solar Cells with Bandgap Profiling", Sannomiya et al., Technical Digest of The International PVSEC-5, Kyoto, Japan, p.381, 1990, reflectance and texture structure are studied on a reflection layer constituted of silver atoms. In this example, it is reported that the reflection layer is deposited in double layer of silver by changing the substrate temperature, to form effective irregularities, and an increase in short-circuit current in virtue of light entrapment effect has been achieved by combination with the zinc oxide layer.

Japanese Patent No. 3273294 discloses that a zinc oxide film formed from a zinc oxide film manufacturing electrolytic solution, which is composed of an aqueous solution containing 0.001 mol/l to 0.t mol/l of zinc ions and 0.001 mol/l to 0.5 mol/l of nitrate ions, is uniform in thickness and composition and has excellent optical transparency.

Japanese Patent Application Laid-Open No. H10-140373 discloses a zinc oxide thin film manufacturing method which includes a step of forming a first zinc oxide thin film on a substrate by sputtering and a step of immersing the substrate in an aqueous solution that contains at least nitrate ions, zinc ions, and carbohydrate to form a second zinc oxide thin film on the first zinc oxide thin film by causing a current to flow between the substrate and an electrode that is immersed in the solution. According to this manufacturing method, a zinc oxide thin film that shows excellent adhesion to a substrate can be formed at low costs without causing abnormal growth of the film.

Japanese Patent Application Laid-open No. 2001-152390 discloses that a zinc oxide film formed from a zinc oxide film manufacturing electrolytic solution that is composed of an aqueous solution has high electric resistance owing to water absorbed in the zinc oxide film but is reduced in resistance when dried by heating. Also disclosed in Japanese Patent Application Laid-Open No. 2002-237606 is that a solar cell obtained by forming a semiconductor layer on a zinc oxide film whose water content is $7.5 \times 10^{-3}$ mol/cm$^3$ or lower is improved in photoelectric conversion efficiency.

However, when a photovoltaic device is manufactured by forming a semiconductor layer on a zinc oxide thin film that is placed on a metal layer, a back side reflection layer of high reflectance is indispensable for further improvement in photoelectric conversion efficiency. To improve the photoelectric conversion efficiency, in particular, short circuit current, of a photovoltaic device having as a back side reflection layer a zinc oxide film that is formed by depositing on a silver, aluminum, copper, or like other metal thin film on a substrate, the back side metal layer should reflect an increased amount of light toward a semiconductor layer of the photovoltaic device by reducing light absorption of the zinc oxide film which is formed by deposition on the metal layer. If the electric resistance of the zinc oxide film is optimized at the same time, the short circuit current value of the photovoltaic device and the curved factor can be improved even more. Japanese Patent Application Laid-Open No. 2002-237606 points out that reduction in water content of a zinc oxide film slightly lowers the reflectance of the film while the electric resistance of the film is reduced.

It is also preferable for improvement in photoelectric conversion efficiency, short circuit current, in particular, of a photovoltaic device to elongate an optical path by surface irregularities on a back side reflection layer. One method to achieve this is to thicken a zinc oxide film of the photovoltaic device. In this case, however, the electric resistance of the zinc oxide film could be raised owing to the water content of the zinc oxide film (on the premise that a thicker zinc oxide film contains more water) and a contamination source could be created by steam expelled from a substrate when the substrate is heated in a later step (semiconductor deposition step).

In addition, its manufacture process needs to shorten the treatment time of a heat treatment step, uniformize characteristics throughout a large-area substrate region, and reduce the cost of a treatment apparatus.

SUMMARY OF THE INVENTION

The present invention has been made in view of the above circumstances, and a main object of the present invention is therefore to provide with higher productivity a zinc oxide film for use as a back side reflection layer which is improved in light reflectance while reduced in electric resistance and which has optimum characteristics as a substrate for a photovoltaic device.

According to the present invention, there is provided a deposition film (zinc oxide film) treatment method for heating a film of zinc oxide electrochemically deposited on an electroconductive substrate from an aqueous solution, the method being characterized in that a treatment temperature is set to 150° C. or higher and 400° C. or lower, and that the heat treatment employs a N$_2$ or inert gas atmosphere that contains oxygen.

The zinc oxide film treatment method according to the present invention described above further includes the following preferable characteristics:

an oxygen partial pressure ratio to $N_2$ or inert gas is 1% or higher and lower than 10%;

a treatment pressure is set to 5 kPa or higher and lower than 50 kPa;

the inert gas is helium or argon, or a mixture gas of helium and argon;

the electroconductive substrate is a substrate in continuous form and is subjected to heat treatment while wound into a roll; and the temperature of the treatment subject is raised to a treatment temperature at a rate of 2.0° C./min or less.

The zinc oxide film treatment method of the present invention is capable of controlling the water content in a zinc oxide film so that it falls within an optimum range. The water content in a zinc oxide film is preferably $7.5 \times 10^{-3}$ mol/cm$^3$ or less, more preferably $5.0 \times 10^{-3}$ mol/cm$^3$ or less. With the water content confined in this range, a zinc oxide film can have low electric resistance. Although the mechanism is not exactly clear at present, what has been found is that lowering of the total reflectance and diffused reflectance of a zinc oxide film (considered as lowering of transmittance of the zinc oxide film due to lack of oxygen in the zinc oxide film) which is usually accompanied by reduction in water content of the zinc oxide film by heat treatment is avoided by subjecting the zinc oxide film to heat treatment in an inert gas atmosphere that contains oxygen, preferably, in a treatment atmosphere where the oxygen partial pressure ratio is 1% or more and less than 10%. In this way, lowering of the transmittance of the zinc oxide film can be prevented from lowering to improve the total reflectance and diffused reflectance of the film.

Furthermore, the treatment apparatus can be simplified by subjecting a substrate in continuous form to heat treatment with the substrate wound into a roll. Moreover, stress generated during the heat treatment in the zinc oxide film along the length of the substrate in continuous form is reduced by keeping the treatment pressure preferably less than 50 kPa, more preferably 5 kPa or more and less than 50 kPa. Thus the zinc oxide film can receive uniform treatment without deformation of the substrate in continuous form.

Further, according to the present invention, there is provided a method of manufacturing a photovoltaic device, characterized by including a step of forming, on a zinc oxide film heated by a zinc oxide film treatment method according to the present invention described above, semiconductor layers at a temperature lower than the treatment temperature.

Further, according to the present invention, there is provided a zinc oxide film treatment apparatus for heating, at a pressure equal to or lower than an atmospheric pressure, a film of zinc oxide electrochemically deposited on an electroconductive substrate from an aqueous solution, the apparatus characterized by including: exhaust means for reducing the pressure in a treatment chamber to the-atmospheric pressure or lower; heating means for heating the deposition film; and gas introducing means for introducing, into the treatment chamber, $N_2$ or inert gas that contains oxygen.

The zinc oxide film treatment apparatus according to the present invention described above includes the following preferable characteristics:

the heating means has temperature controlling means for controlling the temperature of the treatment subject to 150° C. or higher and 400° C. or lower;

the temperature controlling means has a function of controlling the rate of raising the temperature of the treatment subject to a treatment temperature to 2.0° C./min or less;

the exhaust means has pressure controlling means for controlling the pressure in the treatment chamber to 5 kPa or higher and lower than 50 kPa;

the gas introducing means has gas partial pressure controlling means for controlling the oxygen partial pressure ratio in the gas introduced into the treatment chamber to 1% or higher and lower than 10%; and the zinc oxide film treatment apparatus further includes roll supporting means capable of treating a substrate in continuous form that serves as the electroconductive substrate while the substrate is wound into a roll.

DESCRIPTION OF THE PREFERRED EMBODIMENTS

Figure 1:
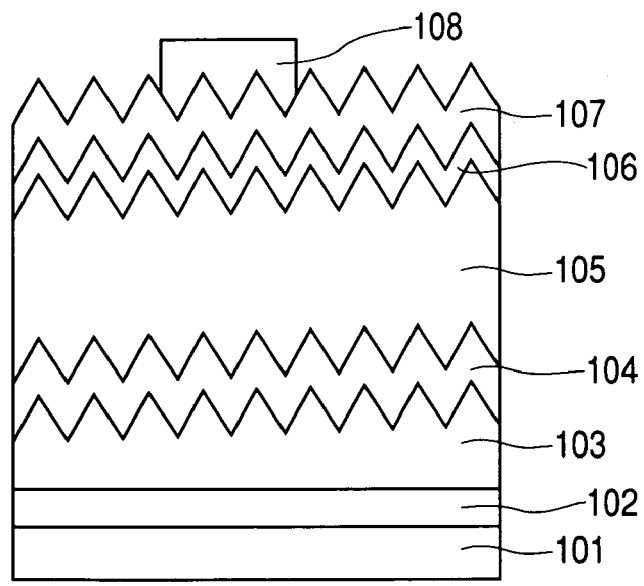
FIG. 1 is a representative schematic sectional view of a photovoltaic device according to the present invention.

A zinc oxide film treatment method of the present invention is suitable for treatment of such a zinc oxide film that is formed from a zinc oxide film manufacturing electrolytic solution composed of an aqueous solution on a substrate in continuous form (e.g., SUS 430 2D), on which a metal layer (silver, aluminum or copper, or an alloy thereof) and another zinc oxide film are formed in advance by sputtering and layered with the zinc oxide film on top of the metal layer.

Described below are effects brought about by characteristics of the present invention.

The present invention is characterized by subjecting an electroconductive substrate, on which a zinc oxide film is formed by deposition from an aqueous solution, to heat treatment within a given temperature range under a $N_2$ or inert gas atmosphere that contains oxygen. As indicated in Japanese Patent Application Laid-Open No. 2002-237606, excessive moisture or oxygen adsorbed in any zinc oxide film affects electric characteristics of the film irrespective of the method employed to form the film and causes problems when the film is used as a back side reflection layer of a photovoltaic device, for example.

On the other hand, an appropriate amount of moisture in a zinc oxide film can give the film an improved transmittance. Specifically, a zinc oxide film having a proper water content exhibits high reflectance as a back side reflection layer of a photovoltaic device and improves the photoelectric conversion efficiency (in particular, short circuit current) of the device.

According to the present invention, the water content in a zinc oxide film is reduced by heat treatment to obtain better electric characteristics and the reflectance characteristics, which would be degraded by heat treatment in prior art, are improved.

Heat treatment lowers the electric resistance of a zinc oxide film and its transmittance as well. Although the mechanism thereof is not exactly clear at present, it is surmised that reduction in water content of the film by heat treatment removes oxygen from the weak oxygen-zinc bond, making the film slightly rich with zinc and thereby giving the film better electric characteristics while lowering the film's light transmittance.

In contrast, the heat treatment method according to the present invention selectively removes water from a zinc oxide film and limits the oxygen desorption reaction during heat treatment. The prevention of oxygen desorption, or re-oxidation of a portion where oxygen desorption has taken place once, is made possible by the presence of a very small amount of oxygen in the treatment atmosphere, specifically, less than 10% partial pressure ratio of oxygen introduced into the treatment atmosphere, and the light transmittance of the zinc oxide film is thus maintained. The inventors of the present invention have confirmed that the once-lowered transmittance of a zinc oxide film can be recovered by heating the film in an atmosphere that contains oxygen, and this confirmation explains how oxidation of a zinc oxide film improves the light transmittance of the film.

Next, a mode of carrying out the present invention is described with reference to the accompanying drawings.

FIG. 1 is a representative schematic sectional view of a photovoltaic device according to the present invention. In FIG. 1, Reference Symbol 101 denotes a substrate (support member); 102, a metal layer (back side reflection layer); and 103, a zinc oxide layer composed of hexagonal polycrystals. Denoted by 104, 105, and 106 are semiconductor layers. Reference Symbol 107 represents a transparent electroconductive layer; and 108, a collector electrode. In a structure in which light enters from a transparent substrate, those layers excluding the substrate are formed in the reverse order.

(Substrate)

The substrate 101 is a metal layer or a resin, glass, ceramic, or like other substrate coated with an electroconductive material. The substrate 101 may have minute surface irregularities. A transparent substrate may be employed as the substrate 101 so that light enters from the substrate side. If the substrate 101 is in continuous form, a zinc oxide film can be formed continuously. In this case, a flexible material such as stainless steel or polyimide is particularly preferable for the substrate 101.

(Metal Layer)

The metal layer 102 serves as an electrode and as a reflection layer for reflecting light that has reached the substrate 101 in order to reuse the light in the semiconductor layers. The metal layer is formed from Al, Cu, Ag, Au, or the like by evaporation, sputtering, electrolytic deposition, printing, or other methods. The metal layer can be omitted if the substrate is electroconductive.

The metal layer 102 preferably has surface irregularities, so that an optical path of the reflected light is elongated in the semiconductor layers and the short circuit current is accordingly increased.

(Zinc Oxide Layer)

The zinc oxide layer 103 increases diffuse reflection of incident light and of reflected light to elongate their optical path lengths in the semiconductor layers. The zinc oxide layer 103 also prevents elements of the metal layer 102 from diffusing or migrating into the semiconductor layers to cause the photovoltaic device to shunt. In addition, with its resistance set appropriately, the zinc oxide layer 103 prevents short circuit due to pinholes and like other defects of the semiconductor layers. Similarly to the metal layer 102, the zinc oxide layer 103 preferably has surface irregularities.

The zinc oxide layer 103 is formed by an electrolytic deposition method described below. It is more preferable to form a zinc oxide film on the metal layer 102 by sputtering or the like before another zinc oxide film is formed on the former zinc oxide film by electrolytic deposition. This is because the adhesion between the metal layer 102 and the zinc oxide layer 103 is improved.

(Method of Forming the Zinc Oxide Layer by Electrolytic Deposition)

Figure 2:
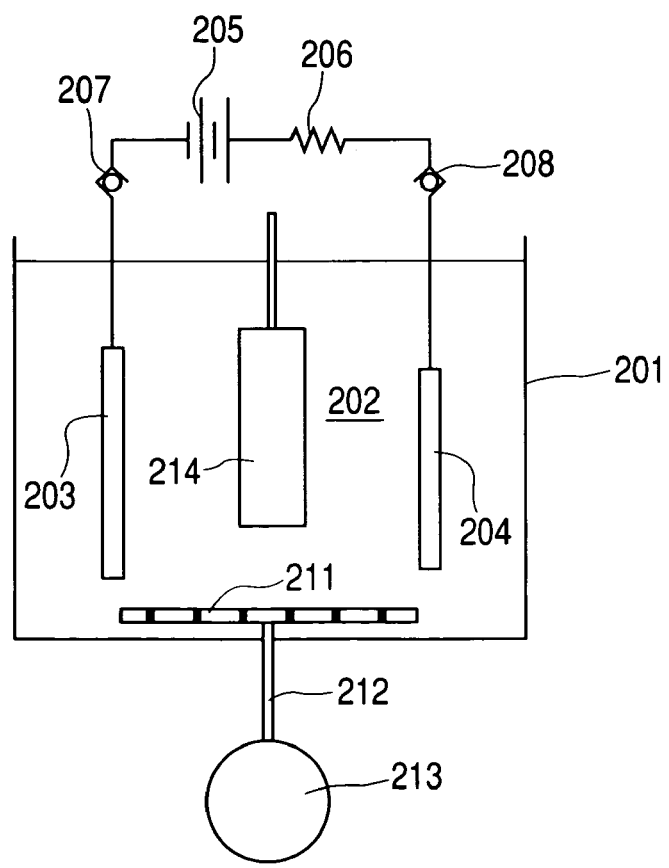
FIG. 2 is a schematic sectional view of an apparatus for forming a zinc oxide layer by electrolytic deposition.

For example, an apparatus shown in FIG. 2 can be used to form the zinc oxide layer 103. In FIG. 2, Reference Symbol 201 denotes an anti-corrosion vessel; 202, an electrolytic deposition aqueous solution; 203, an electroconductive substrate; 204, a counter electrode; 205, a power source; 206, a load resistor; 207, a substrate supporting shaft; and 208, an electrode supporting shaft.

The electrolytic deposition aqueous solution 202 is an aqueous solution containing at least zinc ions and nitrate ions, and saccharose or dextrin. The zinc ion concentration is preferably 0.002 mol/l to 3.0 mol/l, more preferably 0.01 mol/l to 1.5 mol/l, optimally 0.05 mol/l to 0.7 mol/l. The nitrate ion concentration is preferably 0.004 mol/l to 6.0 mol/l, more preferably 0.01 mol/l to 1.5 mol/l, optimally 0.1 mol/l to 1.4 mol/l. The saccharose concentration is preferably 1 g/l to 500 g/l, more preferably 3 g/l to 100 g/l. The dextrin concentration is preferably 0.01 g/l to 10 g/l, more preferably 0.025 g/l to 1 g/l. With the use of an aqueous solution having the above concentrations, a zinc oxide thin film of a texture structure suitable for the light entrapment effect can be formed efficiently.

The electroconductive substrate 203 is the substrate 101 on which the metal layer 102 is formed. The counter electrode 204 is made from a zinc plate with its surface buffed, and serves as an anode. The zinc content of the zinc plate is preferably 90% or higher, more preferably 99% or higher.

The counter electrode 204 is controlled in a manner that a constant current is allowed to flow. The current value thereof is preferably 0.1 mA/cm$^2$ to 100 mA/cm$^2$, more preferably 1 mA/cm$^2$ to 30 mA/cm$^2$, optimally 3 mA/cm$^2$ to 15 mA/cm$^2$.

(Semiconductor Layer)

The semiconductor layers 104, 105, and 106 are formed from amorphous or microcrystalline Si, C, or Ge, or an alloy thereof. The semiconductor layers also contain hydrogen and/or halogen atoms. A preferable content of hydrogen and/or halogen atoms is 0.1 through 40 atm %. The semiconductor layers may additionally contain oxygen, nitrogen, and the like. The concentration of these impurities is desir ably $5\times10^{19}/cm^3$ or less. The semiconductor layers also contain an element belonging to Group III in order to obtain the p-type conductivity and an element belonging to Group V in order to obtain the n-type conductivity.

In the case of a stacked cell, a semiconductor layer of an i type of a pin junction near the light incident side is wide in band gap. The band gap preferably becomes narrower for a farther pin junction. The local minimal value of the band gap is preferably located nearer to the p layer than the middle of the thickness of the i layer.

For a doped layer on the light incident side, a crystalline semiconductor that absorbs light in a smaller quantity or a semiconductor having a wide band gap is suitable.

Microwave (MW) plasma CVD or radio frequency (RF) CVD is a method suitable for forming the semiconductor layers.

An example of a deposition technique that can be employed to form the semiconductor layers is disclosed in Japanese Patent Application Laid-Open No. 04-119843 in which an i layer is formed of graded SiGe and has a Ge composition ratio of 20 to 70 atm %.

(Transparent Electrode Layer)

The transparent electrode layer 107 can double as an anti-reflection layer if set to an appropriate thickness. ITO, ZnO, $In_2O_3$, or like other material is used to form the transparent electrode layer by evaporation, CVD, spraying, spin-on, immersion, etc. A substance that causes a change in electric conductivity may be added to those compounds.

(Collector Electrode)

The collector electrode 108 is provided to improve the current collection efficiency. The collector electrode 108 can be obtained by forming a metal film into a current collection pattern by sputtering with the use of a mask, or by printing with an electroconductive paste or solder paste as ink, or by fixing a metal wire with an electroconductive paste.

If necessary, a protective layer is formed on each side of the photovoltaic device. A reinforcing member such as a steel plate may be employed at the same time.

(Apparatus for Forming a Continuous Film on a Substrate in continuous Form)

Figure 4:
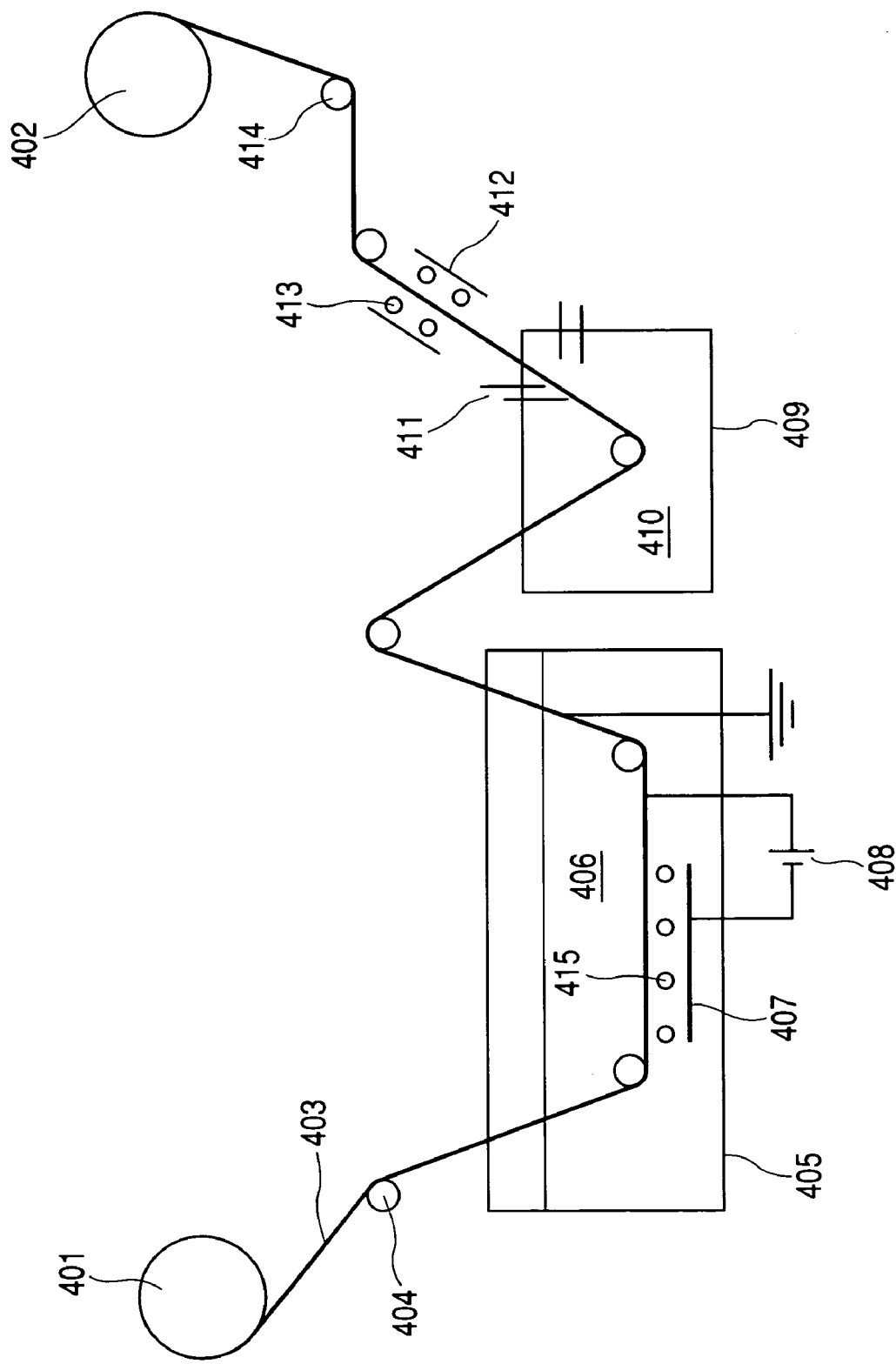
FIG. 4 is a schematic sectional view of an apparatus for forming a continuous zinc oxide layer on a substrate in continuous form by electrolytic deposition.

A description is given concerning how a zinc oxide film is formed by deposition with reference to FIG. 4, which shows an apparatus for forming a continuous film on a substrate in continuous form. In FIG. 4, Reference Symbol 401 denotes a feeding roller; 402, a reel-in roller; 403, a substrate in continuous form; 404, a transporting roller; 405, a zinc oxide forming tank; 406, a zinc oxide forming bath; 407, a counter electrode; 408, a DC power source; 409, a washing tank; 410, a pure water washing tank; 411, a pure water shower; 412, a drying furnace; 413, air holes; 414, a meandering correction roller; and 415, air jet holes.

The substrate in continuous form 403 wound around the feeding roller 401 is transported along a path shown in FIG. 4 and is reeled onto the reel-in roller 402 while a slight positional displacement of the substrate is corrected by the meandering correction roller 414.

The zinc oxide forming bath 406 of the zinc oxide forming tank 405 is the above-described electrolytic deposition aqueous solution which contains nitrate ions, zinc ions, and saccharose or dextrin.

The counter electrode 407 has one or more square-shaped zinc plates with a 99.99% purity. The DC power source 408 is controlled to apply voltages in a manner that the substrate in continuous form 403 is made to be a cathode and the counter electrode 407 is made to be an anode and to cause a constant current flow.

The temperature of the electrolytic deposition aqueous solution is set to 50° C. or higher. An appropriate amount of air from an air injection pump (not shown in the drawing) is injected into the bath through the air jet holes 415, which are provided in a side wall of the zinc oxide forming tank to stir the bath. In this way, a uniform zinc oxide film with reduced abnormal growth can be formed efficiently.

(Heat Treatment Apparatus for a Substrate in Continuous Form)

Figure 5A:
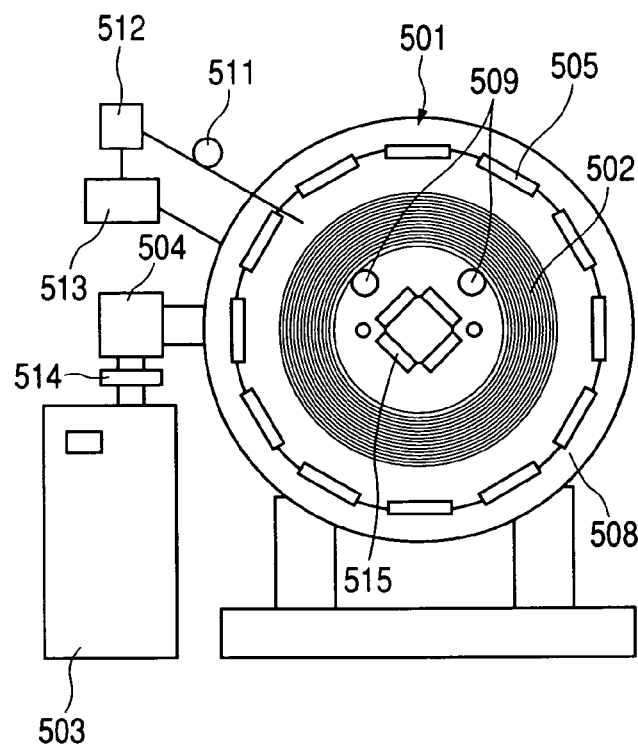
FIGS. 5A and 5B are diagrams showing an example of a zinc oxide film treatment apparatus according to the present invention.
Figure 5B:
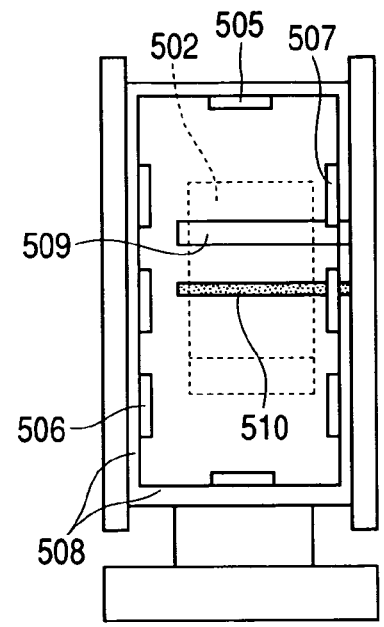

An example of a heat treatment apparatus according to the present invention is shown in FIGS. 5A (front view) and 5B (side view). In FIGS. 5A and 5B, Reference Symbol 501 denotes a heat treatment furnace (treatment chamber); 502, a treatment subject (substrate in continuous form); 503, a vacuum discharge pump; 504, a trap; 505, a side heater unit; 506, a front heater unit; 507, rear heater unit; 508, reflection plates; 509, bobbin supporting posts; 510, gas introducing holes; 511, a temperature monitoring thermocouple; 512, a heater output controller; 513, a heater power source; 514, a pressure adjusting valve; and 515, a central heater unit.

A zinc oxide film is formed on the substrate in continuous form 502 by the apparatus shown in FIG. 4 (an apparatus for forming a continuous film on a substrate in continuous form). The substrate is wound around a bobbin made of stainless steel and the bobbin is held by the two bobbin supporting posts 509 set in the reflection plates 508.

The interior of the treatment chamber 501 is evacuated by the vacuum discharge pump 503 and the pressure adjusting valve 514 to set the pressure in the chamber to 100 Pa or lower. After the vacuum discharge, nitrogen and oxygen are introduced into the chamber while the flow rate thereof is controlled by a mass flow controller (not shown in the drawing) until a desired pressure level is reached. The treatment subject 502 is heated by the side, front, and rear heater units 505 to 507 installed on the reflection plates 508 and by the central heater unit 515 set in the center of the treatment subject 502. The temperature in the treatment chamber is set to a desired level by monitoring the temperature gauge (hollow thermocouple) 511 and controlling the output of the heater power source 513 through the heater output controller 512. After the heat treatment is completed, the treatment subject is cooled down to room temperature while the conditions and atmosphere used in the heat treatment are maintained.

Examples of the present invention are described below but the present invention is not limited to the following Examples. In particular, a mixture gas of oxygen and nitrogen used as atmosphere gas during heat treatment in the following Examples can be replaced by a mixture gas of oxygen and inert gas such as helium or argon.

EXAMPLE 1

In this example, a zinc oxide film was formed with the use of an electrodeposition apparatus as the one shown in FIG. 2 and was subjected to heat treatment.

The electroconductive substrate 203 on the cathode side was prepared by forming a silver film with a thickness of 800 nm on a 50-mm square stainless steel plate 430 BA having a thickness of 0.15 mm. The silver film was formed by a sputtering apparatus (ULVAC SBH-2206DE) in an argon atmosphere through application of a constant current of 0.3 A with the pressure set to 0.399 Pa and the temperature set to 350° C. The counter electrode 204 on the anode side was a 40-mm square zinc plate having a 99.99% purity and a thickness of 1.2 mm. The distance between the counter electrode 204 and the electroconductive substrate 203 was fixed and set to 50 mm.

The aqueous solution 202 was prepared by adding 12 g/l of saccharose to 0.15 mol/l of zinc nitrate having a temperature of 80° C. The solution was stirred by a stirrer 214. The current of 3.0 mA/cm$^2$ (0.3 A/dm$^2$) and 1.0 mA/cm$^2$ (0.1 A/dm$^2$) were caused to flow between the counter electrode 204 on the anode side and the substrate 203 on the cathode side with the substrate 203 on the cathode side serving as earth, carrying out electrolytic deposition. A zinc oxide film formed by the electrolytic deposition was 2.6 µm in thickness.

Figure 3:
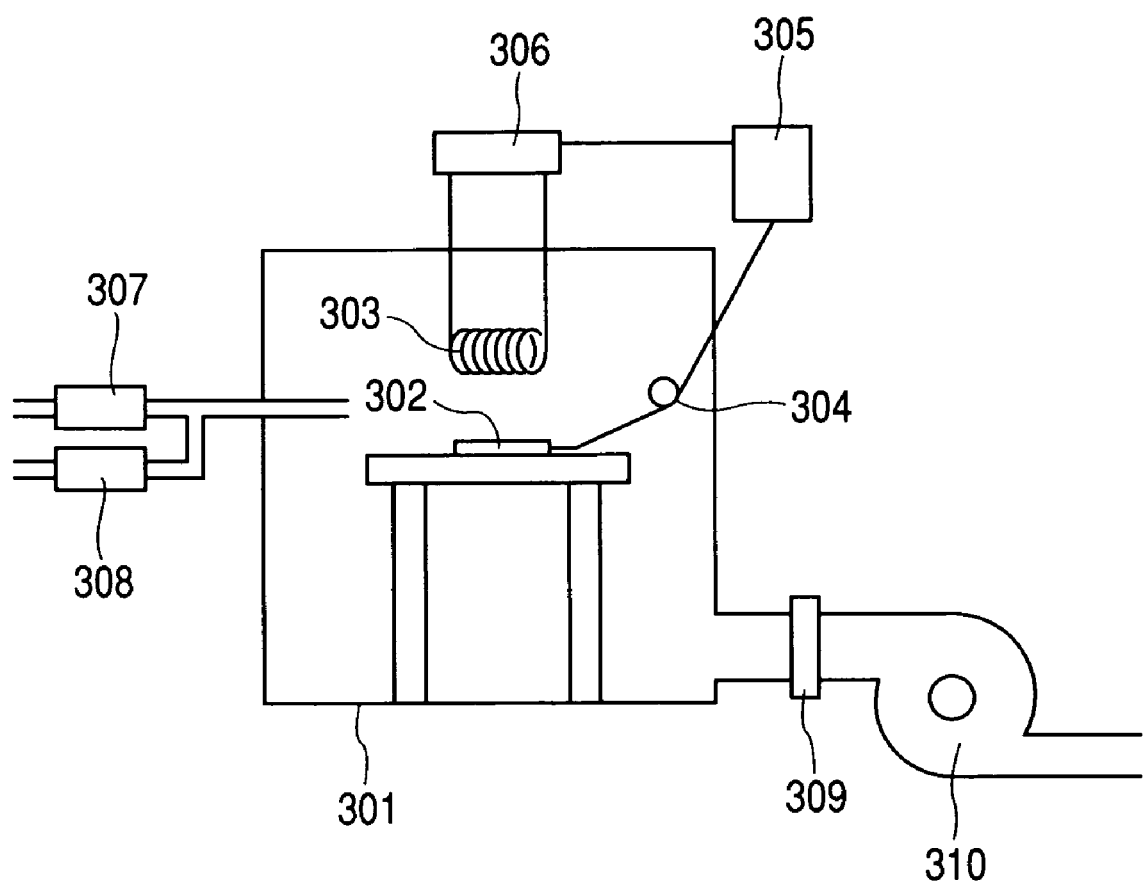
FIG. 3 is a schematic diagram showing an example of a zinc oxide film treatment apparatus according to the present invention.

The substrate on which the zinc oxide film was formed was put in a heat treatment furnace shown in FIG. 3 for heat treatment. In FIG. 3, reference numeral 301 denotes a heat treatment furnace, 302, a treatment subject (the above-described substrate having the zinc oxide film formed thereon), 303, a heater, 304, a treatment furnace temperature monitoring thermocouple, and 305, a heater output adjuster. Denoted by 306 is a heater output system, 307, a nitrogen gas mass flow controller, 308, an oxygen gas mass flow controller, 309, a pressure adjusting valve, and 310, a vacuum discharge pump.

First, the substrate 302 was placed immediately below the heater 303 and the interior of the heat treatment furnace 301 was evacuated by the vacuum discharge pump 310 until the pressure was reduced to 100 Pa or lower. After the vacuum discharge, oxygen gas and nitrogen gas were introduced into the furnace while the flow rate ratio thereof was controlled by the nitrogen gas mass flow controller 307 and the oxygen gas mass flow controller 308 so that the oxygen partial pressure was set to be 2%. The furnace was left standing until the pressure in the treatment furnace reached 15 kPa. As soon as the pressure 15 kPa was reached, heating was started and the treatment furnace was evacuated by controlling the pressure adjusting valve 309 so that the pressure in the treatment furnace was kept at 15 kPa during the treatment.

The substrate was subjected to 10-minute heat treatment under the heating conditions including raising the substrate temperature to 150° C. at a rate of 2.0° C./min, and then keeping the temperature at 150° C. The heating conditions were set by controlling the heater output by the heater output system 306.

After the heat treatment was completed, the heaters were turned off to cool the substrate down to room temperature while maintaining the pressure and the oxygen and nitrogen flow rate ratio so that the oxygen partial pressure was set to be 2%. Once room temperature was reached, the substrate 302 was taken out of the heat treatment furnace 301 to measure the total reflectance and diffused reflectance, the water content of the zinc oxide film, and the electric resistance.

The total reflectance and the diffused reflectance were measured by a spectrometer (V-570, a product of Jasco Corporation) within an optical wavelength range of 400 nm to 1200 nm. The water content in the film was measured by a Karl Fischer moisture titrator (MKC-510, a product of Kyoto Electronics Manufacturing Co., Ltd.). Metal layers (a Cr layer then an Au layer) were formed on the zinc oxide film by evaporation with the use of a vacuum evaporation apparatus and a 0.25 cm$^2$ mask to obtain an upper electrode, and the electric resistance between the upper electrode and the stainless steel substrate was measured. The electric resistance measured is considered to include an error of about 0.1 Ωcm$^2$ since a measuring system including a measuring probe itself has a circuit resistance of about 0.1 Ωcm$^2$.

EXAMPLE 2

A zinc oxide film was formed on a substrate in the same manner as in Example 1. Thereafter, the substrate 302 was put in the heat treatment furnace 301 shown in FIG. 3. The substrate was subjected to 10-minute heat treatment under the heating conditions including raising the substrate temperature to 250° C. at a rate of 2.0° C./min, and then keeping the temperature at 250° C. The heating conditions were set by controlling the heater output system 306.

After the heat treatment was completed, the heaters were turned off to cool the substrate down to room temperature while maintaining the pressure and the oxygen and nitrogen flow rate ratio so that the oxygen partial pressure was set to be 2%. Once room temperature was reached, the substrate 302 was taken out of the heat treatment furnace 301 to measure the total reflectance and diffused reflectance, the water content of the zinc oxide film, and the electric resistance.

EXAMPLE 3

A zinc oxide film was formed on a substrate in the same manner as in Example 1. Thereafter, the substrate 302 was put in the heat treatment furnace 301 shown in FIG. 3. The substrate was subjected to 10-minute heat treatment under the heating conditions including raising the substrate temperature to 300° C. at a rate of 2.0° C./min, and then keeping the temperature at 300° C.

After the heat treatment was completed, the heaters were turned off to cool the substrate down to room temperature while maintaining the pressure and the oxygen and nitrogen flow rate ratio so that the oxygen partial pressure was set to be 2%. Once room temperature was reached, the substrate 302 was taken out of the heat treatment furnace 301 to measure the total reflectance and diffused reflectance, the water content of the zinc oxide film, and the electric resistance in the same manner as in Example 1.

EXAMPLE 4

A zinc oxide film was formed on a substrate in the same manner as in Example 1. Thereafter, the substrate 302 was put in the heat treatment furnace 301 shown in FIG. 3. The substrate was subjected to 10-minute heat treatment under the heating conditions including raising the substrate temperature to 400° C. at a rate of 2.0° C./min, and then keeping the temperature at 400° C.

After the heat treatment was completed, the heaters were turned off to cool the substrate down to room temperature while maintaining the pressure and the oxygen and nitrogen flow rate ratio so that the oxygen partial pressure was set to be 2%. Once room temperature was reached, the substrate 302 was taken out of the heat treatment furnace 301 to measure the total reflectance and diffused reflectance, the water content of the zinc oxide film, and the electric resistance in the same manner as in Example 1

COMPARATIVE EXAMPLE 1

A zinc oxide film was formed on a substrate in the same manner as in Example 1. Thereafter, the total reflectance and diffused reflectance, the water content of the zinc oxide film, and the electric resistance were measured in the same manner as in Example 1 without performing heat treatment.

COMPARATIVE EXAMPLE 2

A zinc oxide film was formed on a substrate in the same manner as in Example 1. Thereafter, the substrate 302 was put in the heat treatment furnace 301 shown in FIG. 3. The substrate was subjected to 10-minute heat treatment under the heating conditions including raising the substrate temperature to 120° C. at a rate of 2.0° C./min, and then keeping the temperature at 120° C.

After the heat treatment was completed, the heaters were turned off to cool the substrate down to room temperature while maintaining the pressure and the oxygen and nitrogen flow rate ratio so that the oxygen partial pressure was set to be 2%. Once room temperature was reached, the substrate 302 was taken out of the heat treatment furnace 301 to measure the total reflectance and diffused reflectance, the water content of the zinc oxide film, and the electric resistance in the same manner as in Example 1.

Next, semiconductor layers, a transparent electroconductive layer, and a collector electrode were formed in order on each of the six substrates on which the zinc oxide films were formed in Examples 1 to 4 and Comparative Examples 1 and 2, thereby obtaining a photovoltaic device as the one shown in FIG. 1.

The semiconductor layers 104 to 106 were formed by CVD. The layer structure thereof is composed of an n type microcrystalline silicon (μc-Si) film formed to a thickness of 30 nm at a temperature of 200° C., a non-doped microcrystalline silicon (μc-Si) film formed to a thickness of 3000 nm at a temperature of 200° C., and a p type microcrystalline silicon (μc-Si) film formed to a thickness of 10 nm at a temperature of 100° C.

An ITO film was formed on the semiconductor layers to a thickness of 65 nm by deposition with the use of a sputtering device to obtain the transparent electroconductive layer 107 as an upper electrode that has an anti-reflection effect.

A silver grid was formed on the transparent electroconductive layer by thermal evaporation to serve as the collector electrode 108, thereby completing the photovoltaic device.

The photovoltaic device thus manufactured was measured for conversion efficiency by a solar simulator (AM 1.5, 100 mW/cm$^2$, surface temperature: 25° C.) for evaluation.

The evaluation results of Examples 1 to 4 and Comparative Examples 1 and 2 are shown in Table 1. The water content in the zinc oxide film is obtained by measuring the water content per 8 cm$^2$ area of the substrate surface, converting it into a water content per 1 cm$^3$ of the zinc oxide film, and expressing it in mol. The electric resistance is an uncorrected value which includes the error due to the measurement circuit. The total reflectance and diffused reflectance are indicated by values at an optical wavelength of 800 nm and, if optical interference causes oscillation, by an average of values at the peaks and troughs of the oscillation. The conversion efficiency (Eff.) and short circuit current (Jsc) of each photovoltaic device are relative values with the conversion efficiency (Eff.) and short circuit current (Jsc) of the photovoltaic device of Comparative Example 1 set as 1.

TABLE 1

| | Water content of the zinc oxide film (mol/cm$^3$) | Electric resistance (Ω/cm$^2$) | Total reflectance (%) | Diffused reflectance (%) | Conversion efficiency (Eff.) | Short circuit current (Jsc) | Series Resistance (Rs) |
| --- | --- | --- | --- | --- | --- | --- | --- |
| Example 1 | 2.10 × 10$^{-3}$ | 0.2-0.4 | 90 | 87 | 1.3 | 1.5 | 2.4 |
| Example 2 | 1.90 × 10$^{-3}$ | 0.2-0.3 | 90 | 86 | 1.5 | 1.6 | 2.2 |
| Example 3 | 1.47 × 10$^{-3}$ | 0.3-0.4 | 87 | 84 | 1.4 | 1.6 | 2.2 |
| Example 4 | 1.21 × 10$^{-3}$ | 0.2-0.4 | 85 | 81 | 1.2 | 1.3 | 2.1 |
| Comparative Example 1 | 8.0 × 10$^{-3}$ | 9.8 | 90 | 87 | 1 | 1 | 7.1 |
| Comparative Example 2 | 3.85 × 10$^{-3}$ | 4.2-6.8 | 90 | 87 | 1.1 | 1 | 4.5 |

As is clear from the results of Table 1, with the treatment condition in Examples 1 to 4 (the treatment temperature: 150° C. or higher and 400° C. or lower), the zinc oxide film after the treatment is sufficiently low in electric resistance and the photovoltaic device manufactured from the substrate on which the zinc oxide film is formed exhibits excellent characteristics.

On the other hand, with the treatment condition in Comparative Example 2 (the treatment temperature: 120° C.), the zinc oxide film after the treatment is high in electric resistance and affects characteristics of the photovoltaic device. It is surmised that the characteristics of the photovoltaic device are seriously degraded by a contamination source, which results from moisture seeping from the zinc oxide film into semiconductor layers of the photovoltaic device as the semiconductor layers are formed by heating, as well as by the high electric resistance of the zinc oxide film.

EXAMPLE 5

A zinc oxide film was formed on a substrate in the same manner as in Example 1. Thereafter, the substrate 302 was put in the heat treatment furnace 301 shown in FIG. 3, and was subjected to heat treatment.

A treatment method is as follows. First, the substrate 302 was placed immediately below the heater 303 and the interior of the heat treatment furnace 301 was evacuated by the vacuum discharge pump 310 until the pressure is reduced to 100 Pa or lower. After the vacuum discharge, oxygen gas and nitrogen gas were introduced into the furnace while the flow rate ratio thereof was controlled by the nitrogen gas mass flow controller 307 and the oxygen gas mass flow controller 308 so that the oxygen partial pressure was set to be 0.5%. As soon as the pressure 15 pKa in the treatment furnace was reached, heating was started and the treatment furnace 301 was evacuated by controlling the pressure in the treatment furnace 301 by the pressure adjusting valve 309 so that the pressure was kept at 15 kPa during the treatment.

The substrate was subjected to 10-minute heat treatment under the heating conditions including raising the substrate temperature to 250° C. at a rate of 2.0° C./min, and then keeping the temperature at 250° C. The heating conditions were set by controlling the heater output by the heater output system 306.

After the heat treatment was completed, the heaters were turned off to cool the substrate down to room temperature while maintaining the pressure and the oxygen and nitrogen flow rate ratio so that the oxygen partial pressure was set to be 0.5%. Once room temperature was reached, the substrate 302 was taken out of the heat treatment furnace 301 to measure the total reflectance and diffused reflectance, the water content of the zinc oxide film, and the electric resistance in the same manner as in Example 1.

EXAMPLE 6

A zinc oxide film was formed on a substrate in the same manner as in Example 1. Thereafter, the substrate 302 was put in the heat treatment furnace 301 shown in FIG. 3, and was subjected to heat treatment.

A treatment method is as follows. First, the substrate 302 was placed immediately below the heater 303 and the interior of the heat treatment furnace 301 was evacuated by the vacuum discharge pump 310 until the pressure was reduced to 100 Pa or lower. After the vacuum discharge, oxygen gas and nitrogen gas were introduced into the furnace while the flow rate ratio thereof was controlled by the nitrogen gas mass flow controller 307 and the oxygen gas mass flow controller 308 so that the oxygen partial pressure was set to be 1.0%. The furnace was left standing until the pressure in the heat treatment furnace 301 reached 15 kPa. As soon as the pressure 15 pKa was reached, heating was started and the treatment furnace was evacuated by controlling the pressure adjusting valve 309 so that the pressure in the heat treatment furnace 301 was kept at 15 kPa during the treatment.

The substrate was subjected to 10-minute heat treatment under the heating conditions including raising the substrate temperature to 250° C. at a rate of 2.0° C./min, and then keeping the temperature at 250° C. The heating conditions were set by controlling the heater output by the heater output system 306.

After the heat treatment was completed, the heaters were turned off to cool the substrate down to room temperature while maintaining the pressure and the oxygen and nitrogen flow rate ratio in such a manner that the oxygen partial pressure was set to be 1.0%. Once room temperature was reached, the substrate 302 was taken out of the heat treatment furnace 301 to measure the total reflectance and diffused reflectance, the water content of the zinc oxide film, and the electric resistance in the same manner as in Example 1.

EXAMPLE 7

A zinc oxide film was formed on a substrate in the same manner as in Example 1. Thereafter, the substrate 302 was put in the heat treatment furnace 301 shown in FIG. 3, and was subjected to heat treatment.

A treatment method is as follows. First, the substrate 302 was placed immediately below the heater 303 and the interior of the heat treatment furnace 301 was evacuated by the vacuum discharge pump 310 until the pressure was reduced to 100 Pa or lower. After the vacuum discharge, oxygen gas and nitrogen gas were introduced into the furnace while the flow rate ratio thereof was controlled by the nitrogen gas mass flow controller 307 and the oxygen gas mass flow controller 308 so that the oxygen partial pressure was set to be 3.0%. The furnace was left standing until the pressure in the heat treatment furnace reached 15 kPa. As soon as the pressure 15 pKa was reached, heating was started and the treatment furnace was evacuated by controlling the pressure adjusting valve 309 so that the pressure in the heat treatment furnace 301 was kept at 15 kPa during the treatment.

The substrate was subjected to 10-minute heat treatment under the heating conditions including raising the substrate temperature to 250° C. at a rate of 2.0° C./min, and then keeping the temperature at 250° C. The heating conditions were set by controlling the heater output by the heater output system 306.

After the heat treatment was completed, the heaters were turned off to cool the substrate down to room temperature while maintaining the pressure and the oxygen and nitrogen flow rate ratio so that the oxygen partial pressure was set to be 3.0%. Once room temperature was reached, the substrate 302 was taken out of the heat treatment-furnace 301 to measure the total reflectance and diffused reflectance, the water content of the zinc oxide film, and the electric resistance in the same manner as in Example 1.

EXAMPLE 8

A zinc oxide film was formed on a substrate in the same manner as in Example 1. Thereafter, the substrate 302 was put in the heat treatment furnace 301 shown in FIG. 3, and was subjected to heat treatment.

A treatment method is as follows. First, the substrate 302 was placed immediately below the heater 303 and the interior of the heat treatment furnace 301 was evacuated by the vacuum discharge pump 310 until the pressure was reduced to 100 Pa or lower. After the vacuum discharge, oxygen gas and nitrogen gas were introduced into the furnace while the flow rate ratio thereof was controlled by the nitrogen gas mass flow controller 307 and the oxygen gas mass flow controller 308 so that the oxygen partial pressure was set to be 5.0%. The furnace was left standing until the pressure in the heat treatment furnace reached 15 kPa. As soon as the pressure 15 pKa was reached, heating was started and the treatment furnace was evacuated by controlling the pressure adjusting valve 309 such that the pressure in the heat treatment furnace 301 was kept at 15 kPa during the treatment.

The substrate was subjected to 10-minute heat treatment under the heating conditions including raising the substrate temperature to 250° C. at a rate of 2.0° C./min, and then keeping the temperature at 250° C. The heating conditions were set by controlling the heater output by the heater output system 306.

After the heat treatment was completed, the heaters were turned off to cool the substrate down to room temperature while maintaining the pressure and the oxygen and nitrogen flow rate ratio so that the oxygen partial pressure was set to be 5.0%. Once room temperature was reached, the substrate 302 was taken out of the heat treatment furnace 301 to measure the total reflectance and diffused reflectance, the water content of the zinc oxide film, and the electric resistance in the same manner as in Example 1.

EXAMPLE 9

A zinc oxide film was formed on a substrate in the same manner as in Example 1. Thereafter, the substrate 302 was put in the heat treatment furnace 301 shown in FIG. 3, and was subjected to heat treatment.

A treatment method is as follows. First, the substrate 302 was placed immediately below the heater 303 and the interior of the heat treatment furnace 301 was evacuated by the vacuum discharge pump 310 until the pressure is reduced to 100 Pa or lower. After the vacuum discharge, oxygen gas and nitrogen gas were introduced into the furnace while the flow rate ratio thereof was controlled by the nitrogen gas mass flow controller 307 and the oxygen gas mass flow controller 308 so that the oxygen partial pressure was set to be 10.0%. The furnace was left standing until the pressure in the heat treatment furnace reached 15 kPa. As soon as the pressure 15 pKa was reached, heating was started and the treatment furnace was evacuated by controlling the pressure adjusting valve 309 such that the pressure in the heat treatment furnace 301 was kept at 15 kPa during the treatment.

The substrate was subjected to 10-minute heat treatment under the heating conditions including raising the substrate temperature to 250° C. at a rate of 2.0° C./min, and then keeping the temperature at 250° C. The heating conditions were set by controlling the heater output by the heater output system 306.

After the heat treatment was completed, the heaters were turned off to cool the substrate down to room temperature while maintaining the pressure and the oxygen and nitrogen flow rate ratio so that the oxygen partial pressure was set to be 10.0%. Once room temperature was reached, the substrate 302 was taken out of the heat treatment furnace 301 to measure the total reflectance and diffused reflectance, the water content of the zinc oxide film, and the electric resistance in the same manner as in Example 1.

COMPARATIVE EXAMPLE 3

A zinc oxide film was formed on a substrate in the same manner as in Example 1. Thereafter, the substrate 302 was put in the heat treatment furnace 301 shown in FIG. 3, and was subjected to heat treatment.

A treatment method is as follows. First, the substrate 302 was placed immediately below the heater 303 and the interior of the heat treatment furnace 301 was evacuated by the vacuum discharge pump 310 until the pressure was reduced to 100 Pa or lower. After the vacuum discharge, only nitrogen gas was introduced into the furnace. As soon as the pressure 15 pKa was reached, heating was started and the treatment furnace was evacuated by controlling the pressure adjusting valve 309 such that the pressure in the heat treatment furnace 301 was kept at 15 kPa during the treatment.

The substrate was subjected to 10-minute heat treatment under the heating conditions including raising the substrate temperature to 250° C. at a rate of 2.0° C./min, and then keeping the temperature at 250° C. The heating conditions were set by controlling the heater output by the heater output system 306.

After the heat treatment was completed, the heaters were turned off to cool the substrate down to room temperature while maintaining the pressure. Once room temperature was reached, the substrate 302 was taken out of the heat treatment furnace 301 to measure the total reflectance and diffused reflectance, the water content of the zinc oxide film, and the electric resistance in the same manner as in Example 1.

Next, semiconductor layers, a transparent electroconductive layer, and a collector electrode were formed in order as described below on each of the six substrates on which the zinc oxide films are formed in Examples 5 to 9 and Comparative Example 3, thereby obtaining a photovoltaic device as the one shown in FIG. 1.

The semiconductor layers 104 to 106 were formed by CVD. The layer structure thereof is composed of an n type microcrystalline silicon (μc-Si) film formed to a thickness of 30 nm at a temperature of 150° C., a non-doped microcrystalline silicon (μc-Si) film formed to a thickness of 3000 nm at a temperature of 200° C., and a p type microcrystalline silicon (μc-Si) film formed to a thickness of 10 nm at a temperature of 100° C.

An ITO film was formed on the semiconductor layers to a thickness of 65 nm by deposition with the use of a sputtering device to obtain the transparent electroconductive layer 107 as an upper electrode that has an anti-reflection effect.

A silver grid is formed on the transparent electroconductive layer by thermal evaporation to serve as the collector electrode 108, thereby completing the photovoltaic device.

The photovoltaic device thus manufactured was measured in conversion efficiency by a solar simulator (AM 1.5, 100 mW/cm$^2$, surface temperature: 25° C.) for evaluation.

The evaluation results of Examples 5 to 9 and Comparative Example 3 are shown in Table 2. The water content in the zinc oxide film is obtained by measuring the water content per 8 cm$^2$ area of the substrate surface, converting it into a water content per 1 cm3 of the zinc oxide film, and expressing it in mol. The electric resistance is an uncorrected value which includes the error due to the measurement circuit. The total reflectance and diffused reflectance are indicated by values at an optical wavelength of 800 nm and, if optical interference causes oscillation, by an average of values at the peaks and troughs of the oscillation. The conversion efficiency (Eff.) and short circuit current (Jsc) of each photovoltaic device are relative values with the conversion efficiency (Eff.) and short circuit current (Jsc) of the photovoltaic device of Comparative Example 1set as 1.

TABLE 2

|  | Water content in the film (mol/cm$^3$) | Electric resistance (Ω/cm$^2$) | Total reflectance (%) | Diffused reflectance (%) | Conversion efficiency (Eff.) | Short circuit current (Jsc) | Series Resistance (Rs) |
|---|---|---|---|---|---|---|---|
| Example 5 | 1.90 × 10$^{-3}$ | 0.8-0.9 | 87 | 83 | 0.98 | 1.00 | 2.0 |
| Example 6 | 2.10 × 10$^{-3}$ | 1.2-1.3 | 89 | 87 | 1.01 | 1.01 | 2.4 |
| Example 7 | 1.90 × 10$^{-3}$ | 1.2-1.3 | 89 | 86 | 1.02 | 1.02 | 2.2 |
| Example 8 | 1.90 × 10$^{-3}$ | 2.3-2.5 | 91 | 87 | 1.06 | 1.01 | 2.2 |

TABLE 2-continued

| | Water content in the film (mol/cm$^3$) | Electric resistance ($\Omega$/cm$^2$) | Total reflectance (%) | Diffused reflectance (%) | Conversion efficiency (Eff.) | Short circuit current (Jsc) | Series Resistance (Rs) |
|---|---|---|---|---|---|---|---|
| Example 9 | 1.50 × 10$^{-3}$ | 6.5-9.0 | 91 | 88 | 1.03 | 0.98 | 5.2 |
| Comparative Example 3 | 1.90 × 10$^{-3}$ | 0.8-1.0 | 86 | 81 | 1 | 1 | 2.0 |

As is clear from the results of Table 2, with the treatment condition in Example 5 (the oxygen partial pressure: 0.5%), the zinc oxide film after the treatment is low in electric resistance but is slightly reduced in reflectance. This makes Example 5 not so different from the sample subjected to heat treatment in an atmosphere that does not contain oxygen (Comparative Example 3).

On the other hand, with the treatment condition in Examples 6 to 8 (the oxygen partial pressure: 1.0 to 5%), the obtained zinc oxide film exhibits fine electric characteristics and is also improved in reflectance. With the treatment condition in Example 9 (the oxygen partial pressure: 10.0%), however, the obtained zinc oxide film has high electric resistance probably due to oxidation that takes place during the heat treatment, and affects characteristics of the photovoltaic device (in the form of an increase in series resistance).

In conclusion, introduction of excessive oxygen during heat treatment impairs electric characteristics of the obtained zinc oxide film and affects characteristics of the photovoltaic device. Here, a preferable oxygen content is 1% or higher and lower than 10% in terms of partial pressure.

EXAMPLE 10

Silver was deposited on a substrate in continuous form made of SUS 430 BA (thickness: 0.15 mm, width: 355 mm, length 1000 m) to a thickness of 800 nm as a metal layer by a DC magnetron sputtering apparatus capable of handling a substrate wound into a roll. The same DC magnetron sputtering apparatus capable of handling a roll of substrate was used to form a zinc oxide thin film by deposition on the silver layer to a thickness of 200 nm.

Then a zinc oxide layer was formed on the thus prepared substrate in continuous form by the apparatus shown in FIG. 4 (apparatus for forming a continuous film on a substrate in continuous form) in a manner described below.

The substrate in continuous form 403 was transported to the zinc oxide forming tank 405 through the transporting roller 404. The zinc oxide forming bath 406 contains 1 liter of water containing 70 g of zinc nitrate hexahydrate, and 0.5 g of dextrin. The solution in the bath was stirred through liquid circulation treatment and by an air jet injected through the air jet holes 415 which are provided in a side wall of the tank at a rate of 20 cm$^3$/h. The temperature of the solution was kept at 85° C. and its pH was so retained as to be 4.0 to 6.0 by a solution circulation system. The counter electrode 407 is a rectangular zinc plate having a 99.99% purity and a buffed surface. A current of 7.0 mA/cm$^2$ (0.7 A/dm$^2$) was caused to flow between the counter electrode 407 on the anode side and the substrate in continuous form 403 on the cathode side with the substrate 403 on the cathode side serving as earth. A zinc oxide film 2.6 µm in thickness was formed at a rate of 55 Å/sec.

After the zinc oxide film was formed, the substrate was wound about a columnar bobbin core, which is 430 mm in diameter, 430 mm in width, and 10 mm in thickness, which is set in the reel-in roller 402, and which is made of stainless steel, while the meandering correction roller 414 regulated motion of the substrate. Thermocouples (each 0.5 mm in diameter) were inserted in the substrate roll in continuous form at points 100 m, 500 m, and 800 m from its inner end while the zinc oxide film was being formed. The thermocouples were provided to measure the temperature of the substrate in the subsequent heat treatment step.

The substrate in continuous form on which the zinc oxide film was formed in the manner described above was put in the heat treatment furnace 501 shown in FIGS. 5A and 5B. The outer end of the substrate roll was fixed before the substrate roll was held by the roll supporting posts 509.

The interior of the heat treatment furnace 501 was evacuated by the vacuum discharge pump 503 until the pressure was reduced to 100 Pa or lower. Thereafter, nitrogen gas containing oxygen (oxygen partial pressure: 2%) was introduced into the heat treatment furnace through the gas introducing holes 510 and the pressure in the heat treatment furnace was so controlled as to be 3 kPa by the pressure adjusting valve 514 during the heat treatment.

The temperature in the heat treatment furnace was kept constant by monitoring the thermocouple 511 attached to the interior of the treatment furnace and controlling the heaters 505, 506, 507, and 515 through control of the output of the heater power source 513 with the use of the output controller 512. The heating conditions include raising the temperature to 250° C. from room temperature at a rate of 2.0° C./min and keeping the temperature at 250° C. for 600 minutes. Then the heaters were turned off to let the substrate cool down to room temperature in the same atmosphere as the treatment environment.

After the substrate was cooled down, the treatment furnace was vented and the rolled substrate was wound off to take samples at points 300 m, 600 m, and 900 m from the inner end of the substrate in continuous form roll. Each of the samples was measured for the total reflectance and diffused reflectance of the zinc oxide film at the ends and center in the substrate width direction, for the water content in the zinc oxide film, and for the electric resistance by a method similar to the measurement method of Example 1.

EXAMPLE 11

A zinc oxide film was formed on the substrate in continuous form 403 in the manner described in Example 10, and the substrate roll 502 was then set in the heat treatment furnace 501 shown in FIGS. 5A and 5B after fixing the outer end of the substrate roll.

The interior of the heat treatment furnace 501 was evacuated by the vacuum discharge pump 503 until the pressure was reduced to 100 Pa or lower. Thereafter, nitrogen gas containing oxygen (oxygen partial pressure: 2%) was introduced into the heat treatment furnace and the pressure in the heat treatment furnace was so controlled as to be 5 kPa during the heat treatment by the pressure adjusting valve 514, which is provided in the vacuum discharge system. The rest of the conditions in the heat treatment were identical to those in Example 10. Then the substrate on which the zinc oxide film was formed was measured for the total reflectance and diffused reflectance, the water content in the zinc oxide film, and the electric resistance.

EXAMPLE 12

A zinc oxide film was formed on the substrate in continuous form 403 in the manner described in Example 10, and the substrate roll 502 was then set in the heat treatment furnace 501 shown in FIGS. 5A and 5B after fixing the outer end of the substrate roll.

The interior of the heat treatment furnace 501 was evacuated by the vacuum discharge pump 503 until the pressure was reduced to 100 Pa or lower. Thereafter, nitrogen gas containing oxygen (oxygen partial pressure: 2%) was introduced into the heat treatment furnace and the pressure in the heat treatment furnace was so controlled as to be 15 kPa during the heat treatment by the pressure adjusting valve 514, which is provided in the vacuum discharge system. The rest of the conditions in the heat treatment were identical to those in Example 10. Then the substrate on which the zinc oxide film was formed was measured for the total reflectance and diffused reflectance, the water content in the zinc oxide film, and the electric resistance.

EXAMPLE 13

A zinc oxide film was formed on the substrate in continuous form 403 in the manner described in Example 10, and the substrate roll 502 was then set in the heat treatment furnace 501 shown in FIGS. 5A and 5B after fixing the outer end of the substrate roll.

The interior of the heat treatment furnace 501 was evacuated by the vacuum discharge pump 503 until the pressure was reduced to 100 Pa or lower. Thereafter, nitrogen gas containing oxygen (oxygen partial pressure: 2%) was introduced into the heat treatment furnace and the pressure in the heat treatment furnace was so controlled as to be 50 kPa during the heat treatment by the pressure adjusting valve 514, which is provided in the vacuum discharge system. The rest of the conditions in the heat treatment were identical to those in Example 10. Then the substrate on which the zinc oxide film was formed was measured for the total reflectance and diffused reflectance, the water content in the zinc oxide film, and the electric resistance.

EXAMPLE 14

A zinc oxide film was formed on the substrate in continuous form 403 in the manner described in Example 10, and the substrate roll 502 was then set in the heat treatment furnace 501 shown in FIGS. 5A and 5B after fixing the outer end of the substrate roll.

The interior of the heat treatment furnace 501 was evacuated by the vacuum discharge pump 503 until the pressure was reduced to 100 Pa or lower. Thereafter, nitrogen gas containing oxygen (oxygen partial pressure: 2%) was introduced into the heat treatment furnace and the pressure in the heat treatment furnace was so controlled as to be 75 kPa during the heat treatment by the pressure adjusting valve 514, which is provided in the vacuum discharge system. The rest of the conditions in the heat treatment were identical to those in Example 10. Then the substrate on which the zinc oxide film was formed was measured for the total reflectance and diffused reflectance, the water content in the zinc oxide film, and the electric resistance.

Tables 3 to 5 show results of measuring the substrates on which the zinc oxide films are formed in Examples 10 to 14. The measurement results in Tables 3 to 5 are for measurements taken at points 300 m, 600 m, and 900 m from the bobbin core in the longitudinal direction of the substrates.

TABLE 3

300 m part from the core of the substrate

| | Water content in the film ($\times 10^{-3}$ mol/cm$^3$) | Electric resistance ($\Omega$/cm$^2$) | Total reflectance | Diffused reflectance |
|---|---|---|---|---|
| Example 10 | 4.0-5.2 | 5.0-5.2 | 91 | 87 |
| Example 11 | 1.6 | 0.8-1.3 | 90 | 89 |
| Example 12 | 1.5-2.0 | 1.2-1.4 | 91 | 89 |
| Example 13 | 1.9-2.1 | 1.5-2.1 | 91 | 88 |
| Example 14 | 3.1-3.2 | 3.0-3.2 | 91 | 88 |

TABLE 4

600 m part from the core of the substrate

| | Water content in the film ($\times 10^{-3}$ mol/cm$^3$) | Electric resistance ($\Omega$/cm$^2$) | Total reflectance | Diffused reflectance |
|---|---|---|---|---|
| Example 10 | 4.0-4.5 | 4.0-4.2 | 91 | 87 |
| Example 11 | 1.6-1.8 | 1.2-2.0 | 90 | 89 |
| Example 12 | 1.6-2.0 | 0.9-1.3 | 91 | 89 |
| Example 13 | 2.0-2.3 | 0.9-1.8 | 91 | 88 |
| Example 14 | 2.1-3.0 | 2.8-3.0 | 90 | 88 |

TABLE 5

900 m part from the core of the substrate

| | Water content in the film ($\times 10^{-3}$ mol/cm$^3$) | Electric resistance ($\Omega$/cm$^2$) | Total reflectance | Diffused reflectance |
|---|---|---|---|---|
| Example 10 | 3.2-3.7 | 3.4-3.6 | 89 | 85 |
| Example 11 | 1.3-1.6 | 1.0-1.3 | 90 | 89 |
| Example 12 | 1.2-1.5 | 0.8-1.1 | 91 | 89 |
| Example 13 | 1.4-1.6 | 0.9-1.5 | 91 | 88 |
| Example 14 | 1.7-2.8 | 2.2-2.8 | 90 | 88 |

Figure 7:
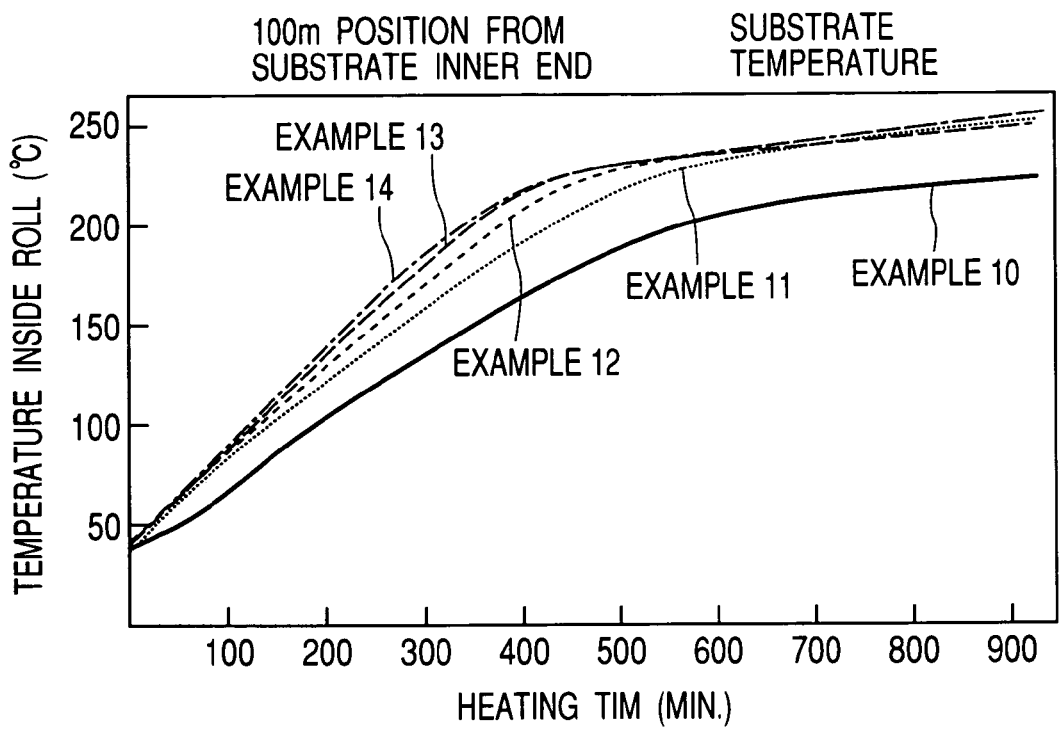
FIG. 7 is a graph showing results of measuring the roll core temperature during heat treatment in Examples 10 through 14.
Figure 8:
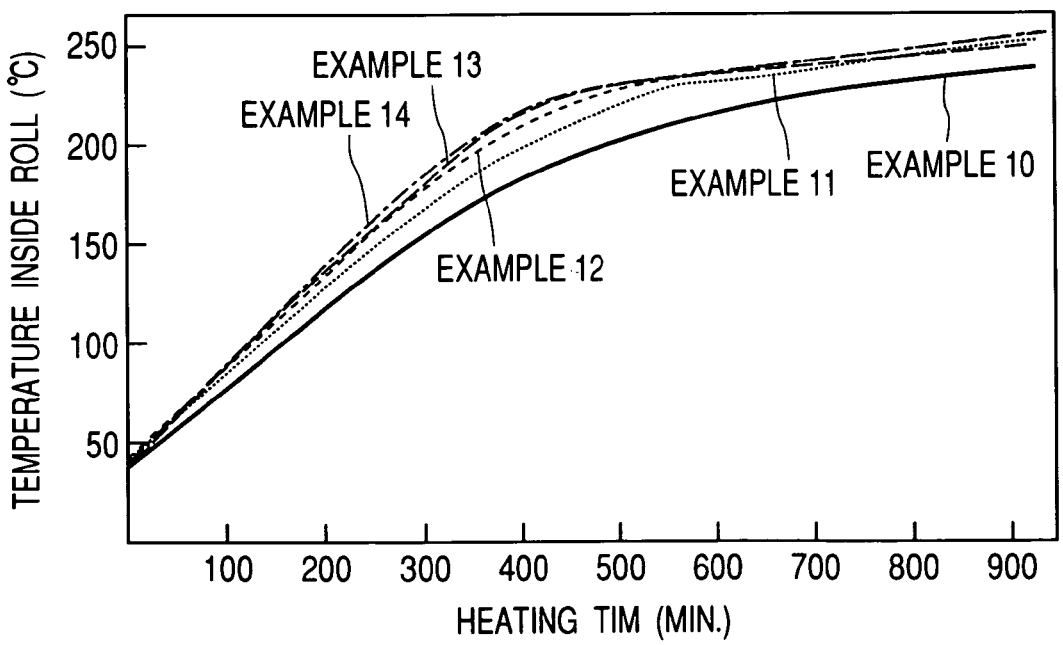
FIG. 8 is a graph showing results of measuring the roll core temperature during heat treatment in Examples 10 through 14.
Figure 9:
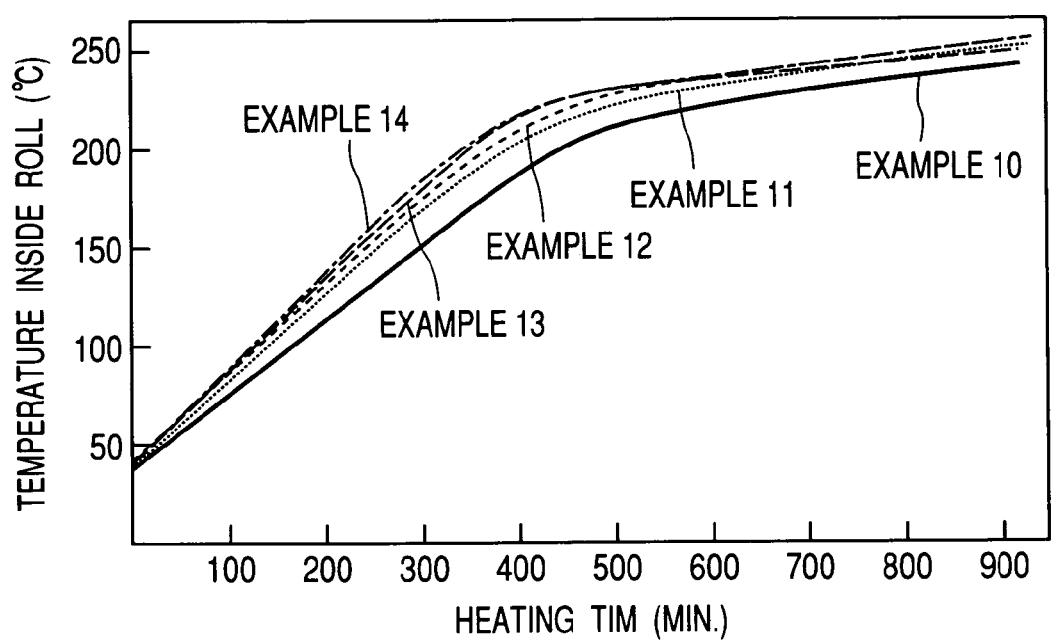
FIG. 9 is a graph showing results of measuring the roll core temperature during heat treatment in Examples 10 through 14.

The results show that a large amount of water remains in the zinc oxide film after heat treatment in which the pressure in the heat treatment furnace is set low (lower than 5 kPa) as in Example 10, causing an increase in electric resistance. This is because the low pressure makes it difficult to raise the overall temperature of the roll and the temperature fails to reach the expected level in the set time period (as is proved by the results of measuring the roll core temperature which are shown in FIGS. 7 through 9). On the other hand, heat treatment with the pressure set high (50 kPa or higher) as in Example 14 causes fluctuation of characteristics between the samples taken from the different points in the substrates (in particular, the reflectance difference is large between the ends and center in the width direction of the substrates). This is because the high pressure prevents oxygen from reaching the inner folds of the substrate roll.

In conclusion, the appropriate pressure range in heat treatment for a substrate in continuous form wound into a roll is 5 kPa or higher and lower than 50 kPa.

EXAMPLE 15

Silver was deposited on a substrate in continuous form made of SUS 430 BA (thickness: 0.15 mm, width: 355 mm, length 1000 m) to a thickness of 800 nm as a metal layer by a DC magnetron sputtering apparatus capable of handling a substrate wound into a roll. The same DC magnetron sputtering apparatus capable of handling a roll of substrate was used to form a zinc oxide thin film by deposition on the silver layer to a thickness of 200 nm.

Then a zinc oxide layer was formed on the thus prepared substrate in continuous form by the apparatus shown in FIG. 4 (apparatus for forming a continuous film on a substrate in continuous form) in a manner described below.

The substrate in continuous form 403 was transported to the zinc oxide forming tank 405 through the transporting roller 404. The zinc oxide forming bath 406 contained 1 liter of water containing 70 g of zinc nitrate hexahydrate, and 0.5 g of dextrin. The solution of the bath was stirred through liquid circulation treatment and by an air jet injected through the air jet holes 415 which are provided in a side wall of the tank at a rate of 20 $cm^3$/h. The temperature of the solution is kept at 85° C. and its pH was so retained as to be 4.0 to 6.0 by a solution circulation system. The counter electrode 407 is a rectangular zinc plate having a 99.99% purity and a buffed surface. A current of 7.0 $mA/cm^2$ (0.7 $A/dm^2$) was caused to flow between the counter electrode 407 on the anode side and the substrate in continuous form 403 on the cathode side with the substrate 403 on the cathode side serving as earth. A zinc oxide film 2.6 μm in thickness was formed at a rate of 55 Å/sec.

After the zinc oxide film was formed, the substrate was wound about a columnar bobbin core, which is 430 mm in diameter, 430 mm in width, and 10 mm in thickness, which is set in the reel-in roller 402, and which is made of stainless steel, while the meandering correction roller 414 regulated motion of the substrate.

The substrate in continuous form on which the zinc oxide film was formed in the manner described above was put in the heat treatment furnace 501 shown in FIGS. 5A and 5B. The outer end of the substrate roll was fixed before the substrate roll was held by the roll supporting posts 509.

The interior of the heat treatment furnace 501 was evacuated by the vacuum discharge pump 503 until the pressure was reduced to 100 Pa or lower. Thereafter, nitrogen gas containing oxygen (oxygen partial pressure: 2%) was introduced into the heat treatment furnace through the gas introducing holes 510 and the pressure in the heat treatment furnace was controlled to 3 kPa by the pressure adjusting valve 514 during the heat treatment.

The temperature in the heat treatment furnace was kept constant by monitoring the thermocouple 511 attached to the interior of the treatment furnace and controlling the heater output with the use of the heater output controller 512. The heating conditions include raising the temperature to 250° C. from room temperature at a rate of 2.0° C./min and keeping the temperature at 250° C. for 600 minutes. Then the heaters were turned off to allow the substrate to cool down to room temperature in the same atmosphere as the treatment environment.

After the substrate was cooled down, the treatment furnace was vented and the rolled substrate was wound off to take samples at points 300 m, 600 m, and 900 m from the inner end of the substrate in continuous form roll. Then, deformation of the substrate was evaluated.

Figure 6:
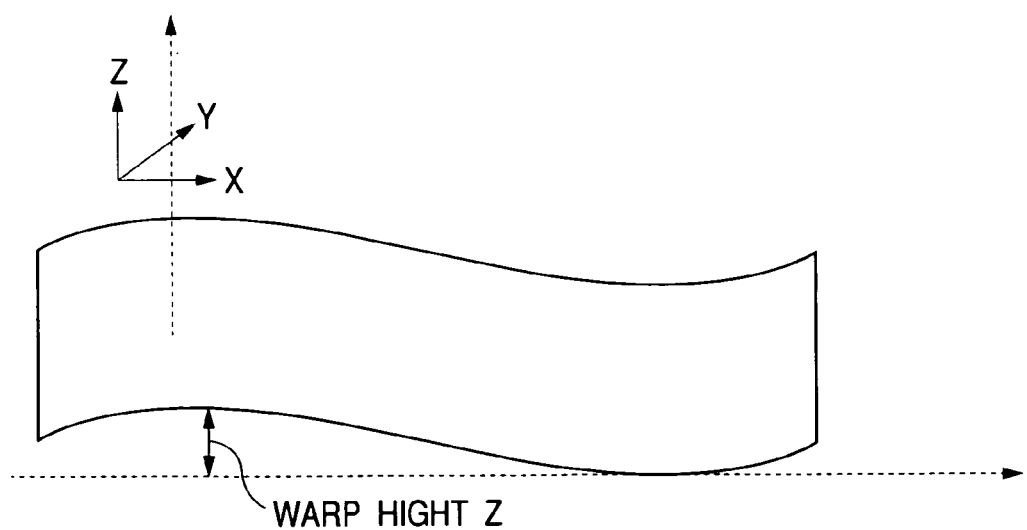
FIG. 6 is a diagram illustrating how deformation of a substrate in continuous form is measured.

The deformation was evaluated by placing a sample substrate on a table or the like with a flat surface and measuring a height Z (longitudinal direction: x, width direction: y, height direction: z) of a waved portion at each end of the sample substrate as shown in FIG. 6.

EXAMPLE 16

A zinc oxide film was formed on a substrate in continuous form in the manner described in Example 15 and the substrate was similarly wound into a roll to be held by the roll supporting posts 509 in the heat treatment furnace 501 shown in FIGS. 5A and 5B. The heating conditions include raising the temperature to 250° C. from room temperature at a rate of 5.0° C./min and keeping the temperature at 250° C. for 600 minutes. Then the heaters were turned off to allow the substrate to cool down to room temperature in the same atmosphere as the treatment environment.

After the substrate was cooled down, the treatment furnace was vented and the rolled substrate was wound off to take samples at points 300 m, 600 m, and 900 m from the inner end of the substrate in continuous form roll. Then, deformation of the substrate was evaluated in the same manner as in Example 1.

The results of deformation of the substrate in Examples 15 and 16 are shown in Table 6.

TABLE 6

| | Substrate position from the bobbin core in the longitudinal direction of the substrate | | |
|---|---|---|---|
| | 300 m part Wave height at the end of the substrate (mm) | 600 m part Wave height at an end of the substrate (mm) | 900 m part Wave height at an end of the substrate (mm) |
| Example 15 | 0.8-1.0 | 0.5-0.6 | 0 |
| Example 16 | 3.5-4.0 | 3.0-3.5 | 3.0-3.2 |

The results show that the substrate in continuous form was deformed at ends in the width direction when the temperature is raised at a rate faster than 2.0° C./min during heat treatment. This is because the heaters heat the substrate roll in continuous form from the outer folds of the roll to bring about a large temperature difference between the roll core and the roll surface and, accordingly, deformation of the substrate.

In the case where a film is formed by CVD on a substrate that has been subjected to heat treatment while transporting the substrate by a roll-to-roll method, deformation of the substrate is undesirable in order to obtain uniform film quality, although depending on the film formation conditions and the apparatus structure (if a film is formed on a deformed substrate by CVD with the use of flat parallel electrodes, the gap between the substrate and the electrodes cannot be uniform). Here, no problem arises when substrate deformation is 1 mm or less.

EXAMPLE 17

Silver was deposited on a substrate in continuous form made of SUS 430 BA (thickness: 0.15 mm, width: 355 mm, length 700 m) to a thickness of 800 nm as a metal layer by a DC magnetron sputtering apparatus capable of handling a substrate wound into a roll. The same DC magnetron sputtering apparatus capable of handling a roll of substrate was used to form a zinc oxide thin film by deposition on the silver layer to a thickness of 200 nm.

Then a zinc oxide layer was formed on the thus prepared substrate in continuous form by the apparatus shown in FIG. 4 (apparatus for forming a continuous film on a substrate in continuous form) in a manner described below.

The substrate in continuous form 403 was transported to the zinc oxide forming tank 405 through the transporting roller 404. The zinc oxide forming bath 406 contained 1 liter of water containing 70 g of zinc nitrate hexahydrate, and 0.5 g of dextrin. The solution of the bath was stirred through liquid circulation treatment and by an air jet injected through the air jet holes 415 which are provided in a side wall of the tank at a rate of 20 cm$^3$/h. The temperature of the solution was kept at 85° C. and its pH was so retained as to be 4.0 to 6.0 by a solution circulation system. The counter electrode 407 is a rectangular zinc plate having a 99.99% purity and a buffed surface. A current of 7.0 mA/c$^2$ (0.7 A/dm$^2$) was caused to flow between the counter electrode 407 on the anode side and the substrate in continuous form 403 on the cathode side with the substrate 403 on the cathode side serving as earth. A zinc oxide film 2.6 μm in thickness was formed at a rate of 55 Å/sec.

After the zinc oxide film was formed, the substrate was wound about a columnar bobbin core, which is 430 mm in diameter, 430 mm in width, and 10 mm in thickness, which is set in the reel-in roller 402, and which is made of stainless steel, while the meandering correction roller 414 regulated motion of the substrate.

The substrate in continuous form on which the zinc oxide film was formed in the manner described above was put in the heat treatment furnace 501 shown in FIGS. 5A and 5B. The outer end of the substrate roll was fixed before the substrate roll was held by the roll supporting posts 509.

The interior of the heat treatment furnace 501 was evacuated by the vacuum discharge pump 503 until the pressure was reduced to 100 Pa or lower. Thereafter, nitrogen gas containing oxygen (oxygen partial pressure: 2%) was introduced into the heat treatment furnace and the pressure in the heat treatment furnace was so controlled as to be 15 kPa by the pressure adjusting valve 514 during the heat treatment.

The temperature in the heat treatment furnace was kept constant by monitoring the thermocouple 511 attached to the interior of the treatment furnace and controlling the heater output with the use of the output controller 512. The heating conditions include raising the temperature to 250° C. from room temperature at a rate of 2.0° C./min and keeping the temperature at 250° C. for 500 minutes. Then the heaters were turned off to let the substrate cool down to room temperature in the same atmosphere as the treatment environment.

After the substrate was cooled down, the treatment furnace was vented and the rolled substrate was wound off to take samples at points 300 m and 600 m from the inner end of the substrate in continuous form roll. Each of the samples was measured for the total reflectance and diffused reflectance of the zinc oxide film at the ends and center in the substrate width direction, for the water content in the zinc oxide film, and for the electric resistance by a method similar to the measurement method of Example 1. Further, deformation of the substrate was evaluated in the same manner as in Example 15.

EXAMPLE 18

A zinc oxide film was formed on a substrate in continuous form at a point 1500 m in the manner described in Example 17 and the substrate was similarly wound into a roll to be held by the roll supporting posts 509 in the heat treatment furnace 501 shown in FIGS. 5A and 5B. The heating conditions include raising the temperature to 250° C. from room temperature at a rate of 2.0° C./min and keeping the temperature at 250° C. for 960 minutes. Then the heaters are turned off to let the substrate cool down to room temperature in the same atmosphere as the treatment environment.

After the substrate was cooled down, the treatment furnace was vented and the rolled substrate was wound off to take samples at points 300 m, 600 m, 900 m, and 1200 m from the inner end of the substrate in continuous form roll. Each of the samples was measured for the total reflectance and diffused reflectance of the zinc oxide film at the ends and center in the substrate width direction, for the water content in the zinc oxide film, and for the electric resistance by a method similar to the measurement method of Example 1. Further, deformation of the substrate was evaluated in the same manner as in Example 15.

Results of Examples 17 and 18 are shown in Tables 7 to 10 (the tables also include the results of Example 12 for comparison). In Table 7, the water content in the zinc oxide film is obtained by measuring the water content per 8 cm$^2$ area of the substrate surface, converting it into a water content per 1 cm$^3$ of the zinc oxide film, and expressing it in mol. The electric resistance shown in Table 8 is an uncorrected value which includes the error due to the measurement circuit. The total reflectance and diffused reflectance shown in Table 9 are indicated by values at an optical wavelength of 800 nm and, if optical interference causes oscillation, by the average of values at the peaks and troughs of the oscillation. Table 10 shows substrate deformation, and the circular symbol (○) indicates that the wave height at an end of the substrate is 1.0 mm or less, the triangular symbol (Δ) indicates that the wave height is 1.0 to 1.5 mm, and the symbol X indicates that the wave height is 1.5 mm or more.

TABLE 7

Water content (mol/cm$^3$) in the zinc oxide film of the sample substrate

Substrate position from the bobbin core in the longitudinal direction of the substrate

|  | 300 m part | 600 m part | 900 m part | 1200 m part |
|---|---|---|---|---|
| Example 12 | 1.5-2.0 × 10$^{-3}$ | 1.6-2.0 × 10$^{-3}$ | 1.2-1.5 × 10$^{-3}$ |  |
| Example 17 | 1.0-1.2 × 10$^{-3}$ | 1.0-1.5 × 10$^{-3}$ |  |  |
| Example 18 | 1.3-1.2 × 10$^{-3}$ | 1.2-1.5 × 10$^{-3}$ | 1.2-1.7 × 10$^{-3}$ | 1.2-1.8 × 10$^{-3}$ |

TABLE 8

Electric resistance (Ω/cm$^3$) of sample substrate

Substrate position from the bobbin core in the longitudinal direction of the substrate

|  | 300 m part | 600 m part | 900 m part | 1200 m part |
|---|---|---|---|---|
| Example 12 | 1.2-1.4 | 0.9-1.3 | 0.8-1.1 |  |
| Example 17 | 1.0-1.2 | 0.8-0.9 |  |  |
| Example 18 | 1.2-1.6 | 1.4-1.6 | 1.2-1.3 | 0.8-1.0 |

TABLE 9

Total reflectance (%)/Diffused reflectance (%) of sample substrate

| | Substrate position from the bobbin core in the longitudinal direction of the substrate | | | |
|---|---|---|---|---|
| | 300 m part | 600 m part | 900 m part | 1200 m part |
| Example 12 | 91/89 | 91/89 | 91/89 | |
| Example 17 | 90/88 | 90/88 | | |
| Example 18 | 91/88 | 91/88 | 91/89 | 90/89 |

TABLE 10

Deformation of the sample substrate

| | Substrate position from the bobbin core in the longitudinal direction of the substrate | | | |
|---|---|---|---|---|
| | 300 m part | 600 m part | 900 m part | 1200 m part |
| Example 12 | ○ | ○ | ○ | |
| Example 17 | ○ | ○ | | |
| Example 18 | ○ | ○ | ○ | ○ |

The results show that heat treatment under heat treatment conditions according to the present invention provides a zinc oxide film formed on a substrate with uniform characteristics throughout the length of the substrate, and that the water content of the zinc oxide film can be reduced even when the substrate is a substrate in continuous form and wound into a roll during the heat treatment. In addition, a substrate in continuous form of any length can be employed without losing uniform characteristics of a zinc oxide film and without suffering from substrate deformation by simply adjusting the length of the heating time.

Although the above Examples deal with silicon-based photovoltaic devices, the present invention is not limited thereto. The present invention is applicable to other types of photovoltaic devices, for example, a dye-sensitized solar cell. In this case, existing methods can be employed for manufacture of portions of the cell that are not relevant to the zinc oxide film.

As has been described, a zinc oxide film treatment method of the present invention is capable of controlling the water content in a zinc oxide film, lowering the electric resistance of the zinc oxide film, and preventing lowering of the total reflectance and diffused reflectance which is accompanied by reduction in water content of the zinc oxide film by heat treatment. The present invention can also improve the photoelectric conversion efficiency of a photovoltaic device by treating a zinc oxide film by the treatment method of the present invention and forming semiconductor layers of the photovoltaic device on the zinc oxide film at a temperature lower than the heat treatment temperature of the zinc oxide film.

What is claimed is:

1. A zinc oxide film treatment method for heating a film of zinc oxide electrochemically deposited on an electroconductive substrate from an aqueous solution,
    wherein heat treatment is carried out at a treatment temperature of 150° C. or higher and 400° C. or lower in a $N_2$ or inert gas atmosphere that contains oxygen, and
    wherein an oxygen partial pressure ratio to $N_2$ or inert gas is 1% or higher and lower than 10%.

2. A zinc oxide film treatment method according to claim 1, wherein a treatment pressure is set to 5 kPa or higher and lower than 50 kPa.

3. A zinc oxide film treatment method according to claim 2, wherein the inert gas is one of helium, argon, and a mixture gas of helium and argon.

4. A zinc oxide film treatment method according to claim 2, wherein the electroconductive substrate is a substrate in continuous form and is subjected to heat treatment while wound into a roll.

5. A zinc oxide film treatment method according to claim 2, wherein the temperature of the treatment subject is raised to a treatment temperature at a rate of 2.0° C./min or less.

6. A method of manufacturing a photovoltaic device, comprising a step of forming, on a zinc oxide film heated by a zinc oxide film treatment method of claim 2, semiconductor layers at a temperature lower than the treatment temperature.

* * * * *

UNITED STATES PATENT AND TRADEMARK OFFICE
CERTIFICATE OF CORRECTION

PATENT NO. : 7,282,132 B2  Page 1 of 1
APPLICATION NO. : 10/805323
DATED : October 16, 2007
INVENTOR(S) : Iwata et al.

It is certified that error appears in the above-identified patent and that said Letters Patent is hereby corrected as shown below:

COLUMN 3:
Line 57, "the-atmospheric" should read -- the atmospheric --.

COLUMN 14:
Line 25, "treatment-furnace" should read -- treatment furnace --.

COLUMN 16:
Line 45, "per 1 cm3" should read -- per 1 $cm^3$ --.

COLUMN 26:
Line 28, "2," should read -- 1, --;
Line 31, "2," should read -- 1, --;
Line 35, "2," should read -- 1, --; and
Line 39, "claim 2," should read -- claim 1, --.

Signed and Sealed this

Third Day of June, 2008

JON W. DUDAS
*Director of the United States Patent and Trademark Office*